US012638506B2

(12) United States Patent
Rotthaus et al.

(10) Patent No.: US 12,638,506 B2
(45) Date of Patent: May 26, 2026

(54) TEST SYSTEM

(71) Applicant: Siemens Energy Global GmbH & Co. KG, Bayern (DE)

(72) Inventors: Dennis Rotthaus, Dortmund (DE); Marc Schombierski, Mülheim an der Ruhr (DE); Oktay Özcan, Kamp-Lintfort (DE)

(73) Assignee: SIEMENS ENERGY GLOBAL GMBH & CO. KG, Munich (DE)

( * ) Notice: Subject to any disclaimer, the term of this patent is extended or adjusted under 35 U.S.C. 154(b) by 224 days.

(21) Appl. No.: 18/704,701

(22) PCT Filed: Oct. 10, 2022

(86) PCT No.: PCT/EP2022/078087
§ 371 (c)(1),
(2) Date: Apr. 25, 2024

(87) PCT Pub. No.: WO2023/078645
PCT Pub. Date: May 11, 2023

(65) Prior Publication Data
US 2024/0418779 A1     Dec. 19, 2024

(30) Foreign Application Priority Data
Nov. 3, 2021     (DE) ..................... 10 2021 212 377.5

(51) Int. Cl.
*G01R 31/34*          (2020.01)
*G01M 13/00*          (2019.01)
(Continued)

(52) U.S. Cl.
CPC ............. *G01R 31/34* (2013.01); *G01M 13/00* (2013.01); *H02K 11/20* (2016.01); *H02K 15/02* (2013.01)

(58) Field of Classification Search
USPC ...................................................... 324/765.01
See application file for complete search history.

(56) References Cited

U.S. PATENT DOCUMENTS

2002/0135383 A1     9/2002     Haeusermann
2007/0089544 A1     4/2007     Bagley
(Continued)

FOREIGN PATENT DOCUMENTS

CH          703662 A1      2/2012
DE       10107401 A1      8/2002
(Continued)

OTHER PUBLICATIONS

PCT International Search Report and Written Opinion of International Searching Authority mailed Feb. 7, 2023 corresponding to PCT International Application No. PCT/EP2022/078087 filed Oct. 10, 2022.

*Primary Examiner* — Farhana A Hoque
(74) *Attorney, Agent, or Firm* — Wolter Van Dyke Davis, PLLC

(57)          ABSTRACT

A system for testing the condition of a stator and/or rotor of an electrical machine, the system includes a test vehicle, a track-changing unit and a control unit. The test vehicle is equipped with at least one test device and is inserted into the air gap between a rotor and a stator of an electric machine, in particular of a generator, which stator has axially extending laminated core teeth and copper rods disposed between the laminated core teeth, and is rectilinearly displaced along the laminated core teeth of the stator so as to test the state of the stator in the region of the internal circumferential face and/or the state of the rotor in the region of the external circumferential face while using the at least one test device. A test method carried out using such a system is provided.

19 Claims, 5 Drawing Sheets

(51) Int. Cl.
H02K 11/20 (2016.01)
H02K 15/02 (2025.01)

(56)                References Cited

U.S. PATENT DOCUMENTS

| 2009/0256584 A1 | 10/2009 | Moser |
| 2011/0175641 A1 | 7/2011 | Wiesendanger |
| 2015/0200581 A1 | 7/2015 | Kowalski |
| 2019/0126486 A1* | 5/2019 | Hiraguri ................. G01B 5/14 |
| 2022/0224809 A1 | 7/2022 | Borgmann |

FOREIGN PATENT DOCUMENTS

| DE | 102009023194 A1 | 12/2010 |
| DE | 102019207248 A1 | 11/2020 |

* cited by examiner

TEST SYSTEM

CROSS REFERENCE TO RELATED APPLICATIONS

This application is the US National Stage of International Application No. PCT/EP2022/078087 filed 10 Oct. 2022, and claims the benefit thereof, which is incorporated by reference herein in its entirety. The International Application claims the benefit of German Application No. DE 10 2021 212 377.5 filed 3 Nov. 2021.

FIELD OF INVENTION

The invention relates to a system comprising a test vehicle which is equipped with at least one test device and is conceived to be inserted into the air gap between a rotor and a stator of an electric machine, in particular of a generator, which stator has axially extending laminated core teeth and copper rods disposed between the laminated core teeth, and to be rectilinearly displaced along the laminated core teeth of the stator so as to test the state of the stator in the region of the internal circumferential face and/or the state of the rotor in the region of the external circumferential face while using the at least one test device.

BACKGROUND OF INVENTION

The rotor and the stator of a generator of a stationary gas turbine installation are subjected to visual testing at regular maintenance intervals and optionally in the event of extraordinary occurrences such as, for example, in the case of load shedding, so as to determine and locate in particular thermal discoloring, mechanical changes in the form of scratches, impacts, displaced parts or the like, loose parts, foreign matter, etc. In order to enable visual access, the rotor is in most instances removed from the stator, or extracted from the latter. Visual inspection by the testing personnel subsequently takes place by visual checking. Potential findings are photographically documented. The generator can be reassembled and put back into operation again only once the test has been completed and the test results have been evaluated, and optionally once required repair work has been carried out. However, extracting the rotor is associated with great complexity and high costs.

One possibility for carrying out a visual inspection in the assembled state of the stator and the rotor fundamentally lies in the use of a conventional industrial endoscope. However, this does not apply to generators of stationary gas turbine installations with rotor lengths of several meters.

Furthermore known are test vehicles which are equipped with at least one test device and are conceived to be inserted into the air gap between a rotor and a stator of an electric machine, in particular of a generator, which stator has axially extending laminated core teeth and copper rods disposed between the laminated core teeth, and to be rectilinearly displaced along the laminated core teeth of the stator so as to test the state of the stator in the region of the internal circumferential face and/or the state of the rotor in the region of the external circumferential face while using the at least one test device. Such a test vehicle is marketed by the company ABB under the product designation "Air Gas Inspector", for example. A camera system which enables the visual inspection of the rotor and the stator is provided as the test device herein. A substantial advantage lies in that the testing of the rotor and the stator can be carried out in a largely automated manner. However, it is disadvantageous that the test vehicle has to be manually repositioned in the circumferential direction after each pass in the axial direction, before the next test pass in the axial direction can be carried out. The use of this test device is entirely impossible in many generators, in particular in the industrial sector, because the air gap between the rotor and the stator is mostly only accessible by way of a unilateral access at the 12 o'clock position, which is why manual repositioning of the test vehicle in the circumferential direction is impossible.

SUMMARY OF INVENTION

Proceeding from this prior art, it is an object of the present invention to achieve a system of the type mentioned at the outset which can be used more flexibly and is easier to handle.

In order to achieve this object, the present invention achieves a system of the type mentioned at the outset which is characterized in that the system furthermore has a track changeover unit which is insertable into the air gap between the rotor and the stator and is displaceable in the circumferential direction on the stator, comprising a parking cassette which is conceived for receiving the test vehicle and which the test vehicle can move into and out of in the axial direction through a parking cassette opening, at least one drive unit which is preferably pivotably connected to the parking cassette and has at least one motor and is conceived to move the track changeover unit, conjointly with the test vehicle received in the parking cassette, in the circumferential direction, and a controller for controlling at least the track changeover unit. In such a system, the test vehicle can be temporarily parked in the parking cassette of the track changeover unit, and in this parked state be displaced, conjointly with the track changeover unit, in the circumferential direction on the stator. Accordingly, manual repositioning of the test vehicle in the circumferential direction after each axial test pass is no longer required. Time is saved as a result, on the one hand. On the other hand, the operators no longer have to spend a comparatively large amount of time in a very tight space. Moreover, a very high degree of automation is achieved. Overall, the test can be carried out rapidly, easily and cost-effectively.

According to one design embodiment of the present invention, the track changeover unit has two drive units which are positioned on sides of the parking cassette which are mutually opposite in the circumferential direction, and are connected to the parking cassette. Accordingly, a symmetrical structure with a uniform distribution of weight is achieved, this greatly facilitating a reliable functional mode of the track changeover unit.

Each drive unit advantageously has at least two driven drive chains. Thanks to such drive chains, which comprise rubber-like material in particular on the surfaces that contact the stator, uneven spots on the stator surface along the travel path of the track changeover unit can easily be bridged.

A sensor, in particular in the form of a distance sensor, which detects the presence of the test vehicle within the parking cassette is advantageously provided on the parking cassette. The controller can thus set the track changeover unit in motion as soon as said controller receives the corresponding signal of the distance sensor, indicating that the test vehicle is parked in an orderly manner in the parking cassette.

The track changeover unit preferably has at least one sensor, in particular in the form of a gyroscopic sensor, which detects the spatial position of the track changeover unit. Using such a sensor, the spatial position of the track changeover unit can be detected, and knowing the structure of the stator, the position of the track changeover unit relative to the stator. The controller can establish by way of the signal of the sensor whether the track changeover unit has been displaced to the desired new position so as to stop the at least one drive unit in this instance, for example.

The track changeover unit advantageously has at least one camera monitoring the region in front of the parking cassette opening. In particular, two cameras are provided, which in the circumferential direction are positioned on both sides of the parking cassette opening. The at least one camera serves for visually monitoring the parking and the departure of the test vehicle.

At least one illumination unit illuminating the imaging region of the at least one camera is preferably provided. In particular, two illumination units, for example in the form of LED strips, which are positioned adjacent to the respective camera, are provided in particular on the drive units.

The track changeover unit advantageously has accumulator units which are preferably positioned on the at least one drive unit. The track changeover unit is autonomously supplied with energy by these accumulator units.

According to one embodiment of the present invention, when the track changeover unit is placed on a flat surface, the overall height of the track changeover unit including the test vehicle received in the parking cassette is 19 mm or less. With such an overall height, the system can be used in very many generators, this achieving a high level of flexibility.

The track changeover unit is preferably radio controlled.

The test vehicle is advantageously tethered, because a wireless connection of sufficient quality can only be ensured with great complexity in the air gap between the rotor and the stator. Moreover, in the event of the failure, the test vehicle can easily be pulled out of the air gap and evacuated in this way by the cable. The cable is preferably routed through a cable feedthrough opening provided on an axial end wall of the parking cassette, as a result of which a simple structure is achieved.

The test vehicle and the track changeover unit, as is already known in particular from test vehicles of the prior art, on their respective lower side are advantageously provided with a plurality of magnets so as to hold the test vehicle and the track change unit on the stator even when said test vehicle and said track changeover unit are in an upside-down position.

Furthermore, for achieving the object mentioned at the outset, the invention achieves a method for testing an electric machine having a rotor and a stator which has axially extending laminated core teeth and copper rods disposed between the laminated core teeth, while using a system as claimed in one of the preceding claims, said method comprising the following steps:

a) inserting the track changeover unit including the test vehicle received therein into the air gap between the rotor and the stator, and placing the assembly onto the stator;

b) rectilinearly displacing the test vehicle in the axial direction along the laminated core teeth of the stator, wherein the test vehicle, while using the at least one test device, tests the state of the stator in the region of the internal circumferential face and/or the state of the rotor in the region of the external circumferential face along the axial displacement path;

c) parking the test vehicle in the parking cassette of the track changeover unit;

d) displacing the track changeover unit, conjointly with the test vehicle received therein, in the circumferential direction along the stator;

repeating steps b) to d), in particular until the track changeover unit has been displaced by 360° in the circumferential direction.

BRIEF DESCRIPTION OF THE DRAWINGS

Further advantages and features of the invention will become evident by means of the description hereunder with reference to the appended drawing in which.

DETAILED DESCRIPTION OF INVENTION

Figure 1:
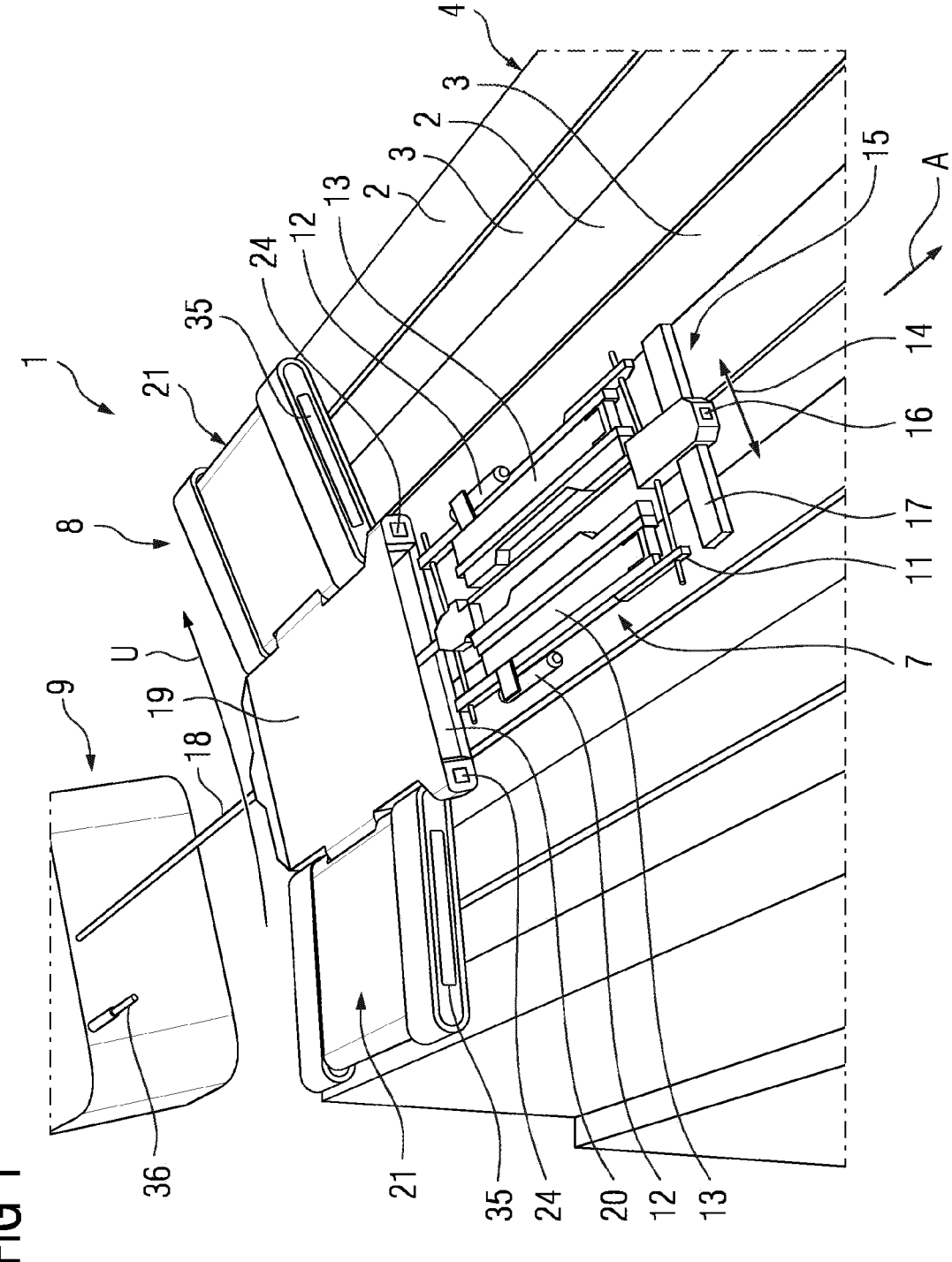
FIG. 1 shows a schematic perspective partial view of a stator of an electric machine, a test vehicle and a track changeover unit of a system according to an embodiment of the present invention being placed onto said stator.
Figure 2:
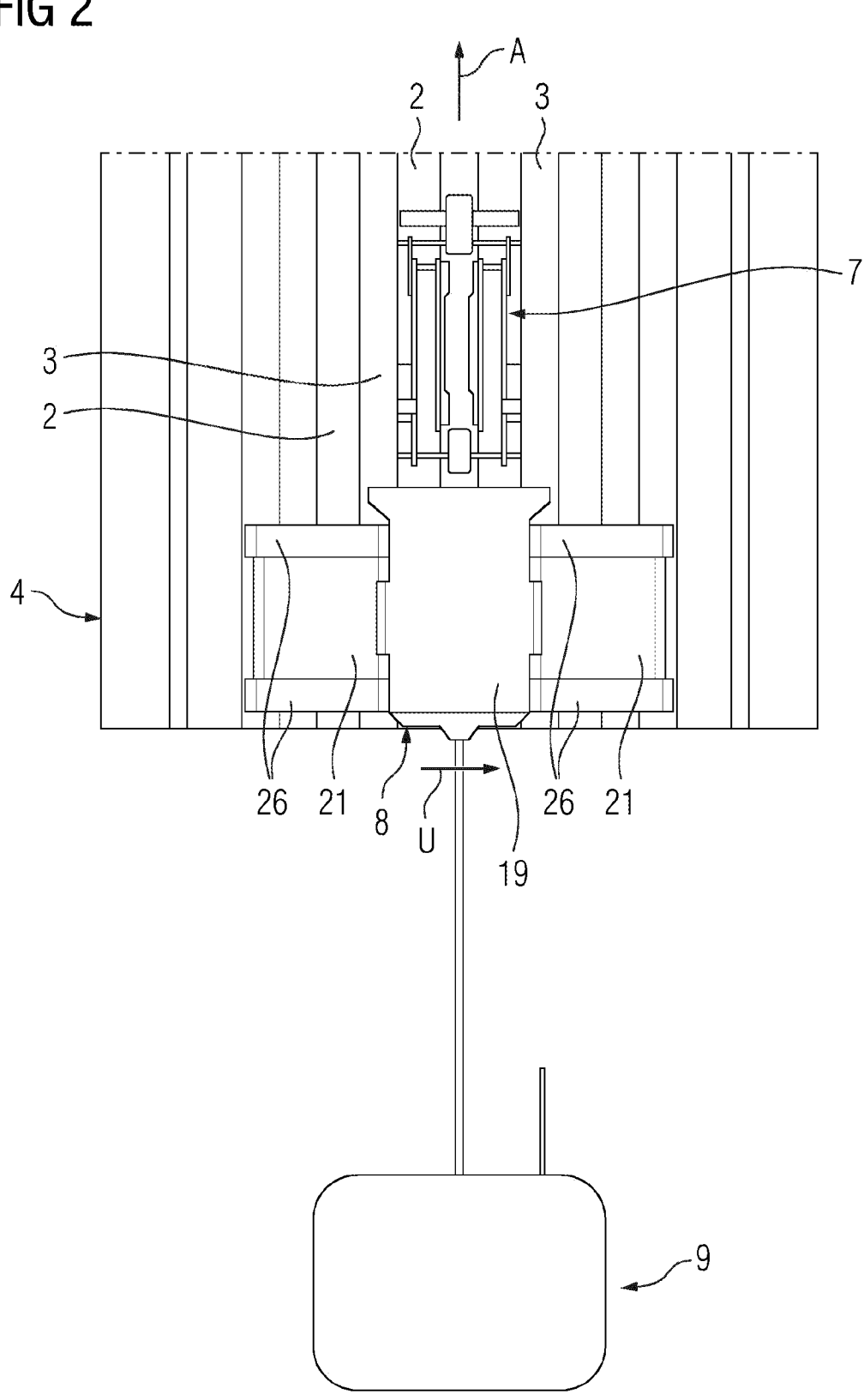
FIG. 2 shows a view from above of the assembly illustrated in FIG. 1.
Figure 3:
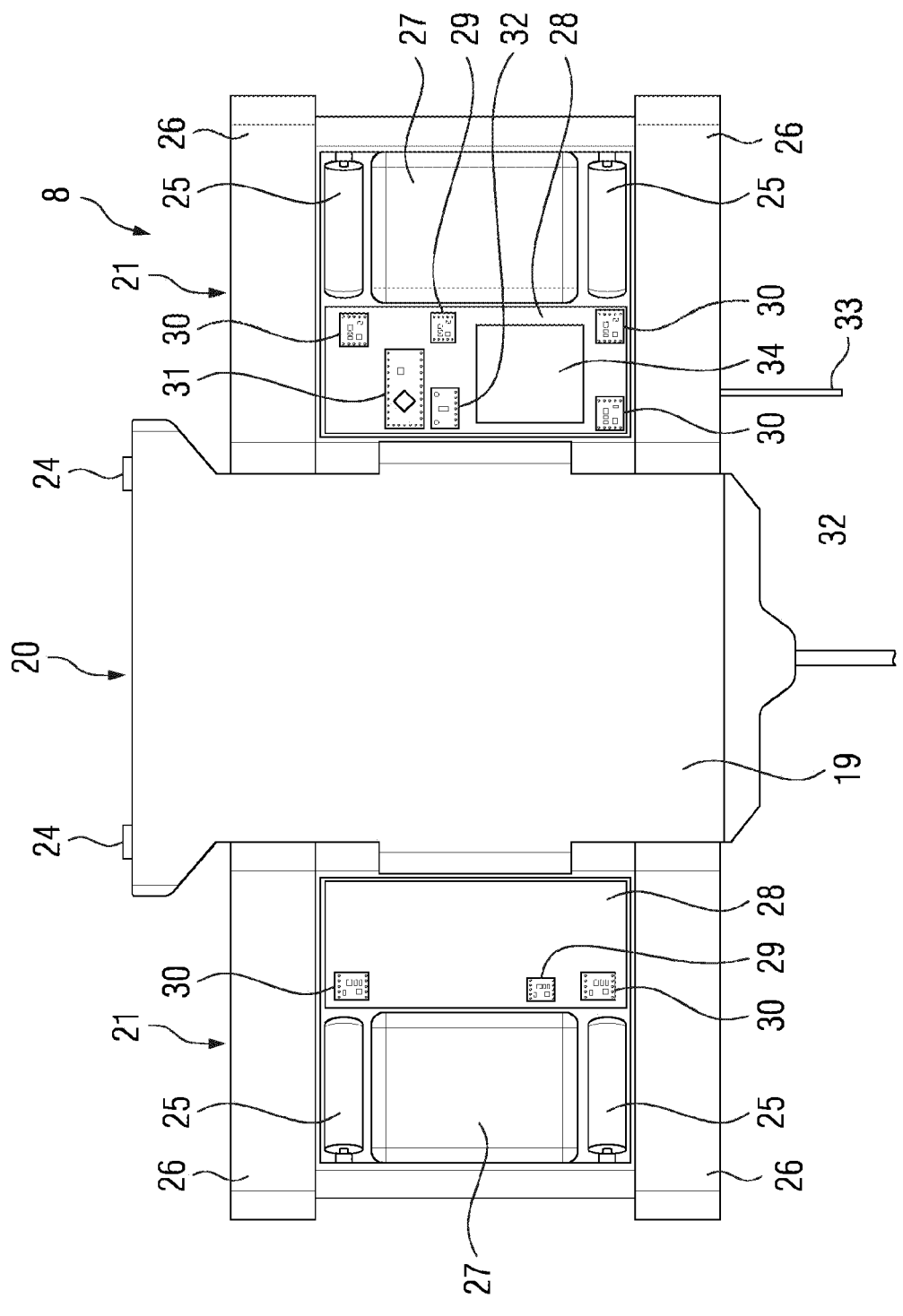
FIG. 3 shows an enlarged view from above of the track changeover unit, wherein the upper housing walls of drive units of the track changeover unit are transparently illustrated for illustrative purposes.
Figure 4:
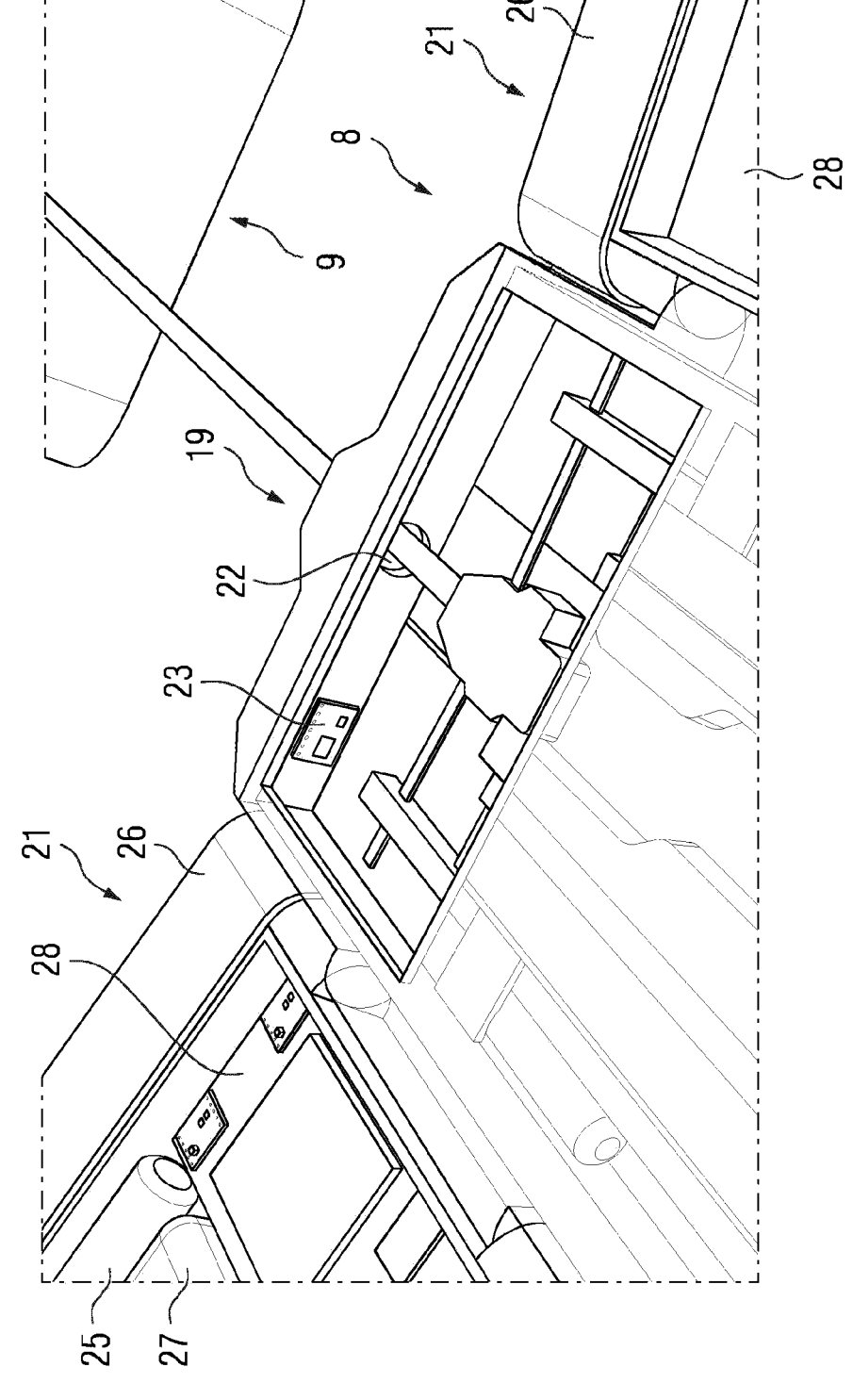
FIG. 4 shows a perspective partial view from above of the track changeover unit, in which also the upper side of the housing of a parking cassette of the track changeover unit in which the test vehicle is received is illustrated so as to be transparent and partially open.

FIGS. 1 to 4 show a system 1 according to an embodiment of the present invention, or components of said system 1, respectively. The system 1 serves for testing the state of a stator 4 which has laminated core teeth 2 and copper rods 3 disposed between the laminated core teeth 2 and/or of a rotor 5 of an electric machine 6, so as to detect damage in order to be able to subsequently repair said damage, wherein the electric machine 6 is presently a generator of a stationary gas turbine installation. The main components of the system 1 are a test vehicle 7, the track changeover unit 8 and a controller 9.

The test vehicle 7 is conceived to be inserted into the air gap 10 between the rotor 5 and the stator 4, and to be rectilinearly displaced in the axial direction A along the laminated core teeth 2 of the stator 4, so as to test the state of the stator 4 in the region of the internal circumferential face and/or the state of the rotor 5 in the region of the external circumferential face. In the embodiment illustrated, the test vehicle 7 comprises a frame 11 on the which are held two electric motors 12 which in each case drive one drive chain 13. The drive chains 13 extend so as to be mutually parallel and presently have a rubber-like material, or are composed of such a material, on the surfaces that contact the stator 4. The spacing of the drive chains 13 is presently variable in the direction of the double arrow 14 in such a way that the test vehicle 7 can be placed onto laminated core teeth 2 of the stator 4 of the electric machine 6 to be tested that are at different mutual spacings, as is shown in FIG. 1. Magnets, which are not illustrated in more detail, are preferably positioned on the lower side of the frame 11, wherein the number, the positions and the strength of the magnets is chosen in such a manner that the test vehicle 7 is also securely held in an upside-down position on the stator 4. A test device 15 which presently comprises a camera 16 and an ultrasonic sensor 17 is positioned in the front region of the frame 11. A cable 18, by way of which the test vehicle 7 is connected to the controller 9 for transmitting current and data, extends from the rear region of the test vehicle 7. In principle, the structure of the test vehicle 7 can be designed in an arbitrary manner in order to fulfil the purpose mentioned at the outset. The test device 15 of the test vehicle 7 can also have arbitrary sensors which enable a corresponding examination of the stator 4 and/or of the rotor 5.

The track changeover unit 8 is conceived in such a manner that it can also be inserted into the air gap 10 between the rotor 5 and the stator. Said track changeover unit 8 serves for transporting the test vehicle 7 in the circumferential direction U of the stator 4, said test vehicle 7 being primarily movable in a rectilinear manner. In the embodiment illustrated, the track changeover unit 8 comprises a parking cassette 19 which is conceived to receive the test vehicle 7 and which the test vehicle 7 can move into and out of in the axial direction A through a parking cassette opening 20, and two drive units 21 which on mutually opposite sides are pivotably connected to the parking cassette 19 and are conceived to move the track changeover unit 8, conjointly with the test vehicle 7 received in the parking cassette 19, in the circumferential direction U. The dimensions of the parking cassette 19 are adapted to the dimensions of the test vehicle 7 in such a manner that the test vehicle 7 can drive into the parking cassette 19 through the parking cassette opening 20 and be received in said parking cassette 19. A cable feedthrough opening 22 through which the cable 18 of the test vehicle 7 is routed is provided in the rear region of the parking cassette 19. Furthermore provided in the rear region of the parking cassette 19, in the interior of the latter, is a sensor 23 which detects the presence of the test vehicle 7 within the parking cassette 19 and is presently designed as a distance sensor. Accordingly, it can be detected by way of the sensor 23 whether or not the test vehicle 7 is parked in an orderly manner in the parking cassette 19. Two cameras 24 which monitor the region in front of the parking cassette opening 20 are positioned in the front region of the parking cassette 19, so as to be adjacent to the parking cassette opening 20. The drive units 21 comprise in each case two motors 25 in the form of electric motors which drive assigned drive chains 26 which extend so as to be mutually parallel in the circumferential direction U of the stator 4 and may likewise be produced from a rubber-like material. For the purpose of supplying energy, each drive unit 21 is presently provided with an accumulator unit 27. Furthermore, the drive units 21 are equipped with circuit boards 28 on the which are positioned voltage regulators 29, motor drivers 30, a microcontroller 31 and the like. One of the circuit boards 28 is furthermore provided with a sensor 32, presently in the form of a gyroscopic sensor, which detects the spatial position of the track changeover unit 8. Moreover, a wireless unit 34 provided with an antenna 33 is positioned on one of the circuit boards 28, said wireless unit 34 handling the data connection to the controller 9. Illumination units 35, presently in the form of LED strips, for illuminating the imaging region of the two cameras 24 positioned on the parking cassette 19 are provided on the respective drive units 21. When the track changeover unit 8 is placed onto a flat surface, the overall height of the track changeover unit 8 including the test vehicle 7 received in the parking cassette 19 is advantageously 19 mm or less.

The controller 9 communicates with the test vehicle 7 by wire, and wirelessly with the track changeover unit 8, for which purpose of the controller 9 is provided with an antenna 36. The communication with the test vehicle 7 by wire ensures a functioning data connection in the environment within the air gap 10 which is problematic in terms of wireless communication. Moreover, in the event of a malfunction of the test vehicle 7, the test vehicle 7 can easily be recovered from the air gap 10 by pulling on the cable 18.

Figure 5:
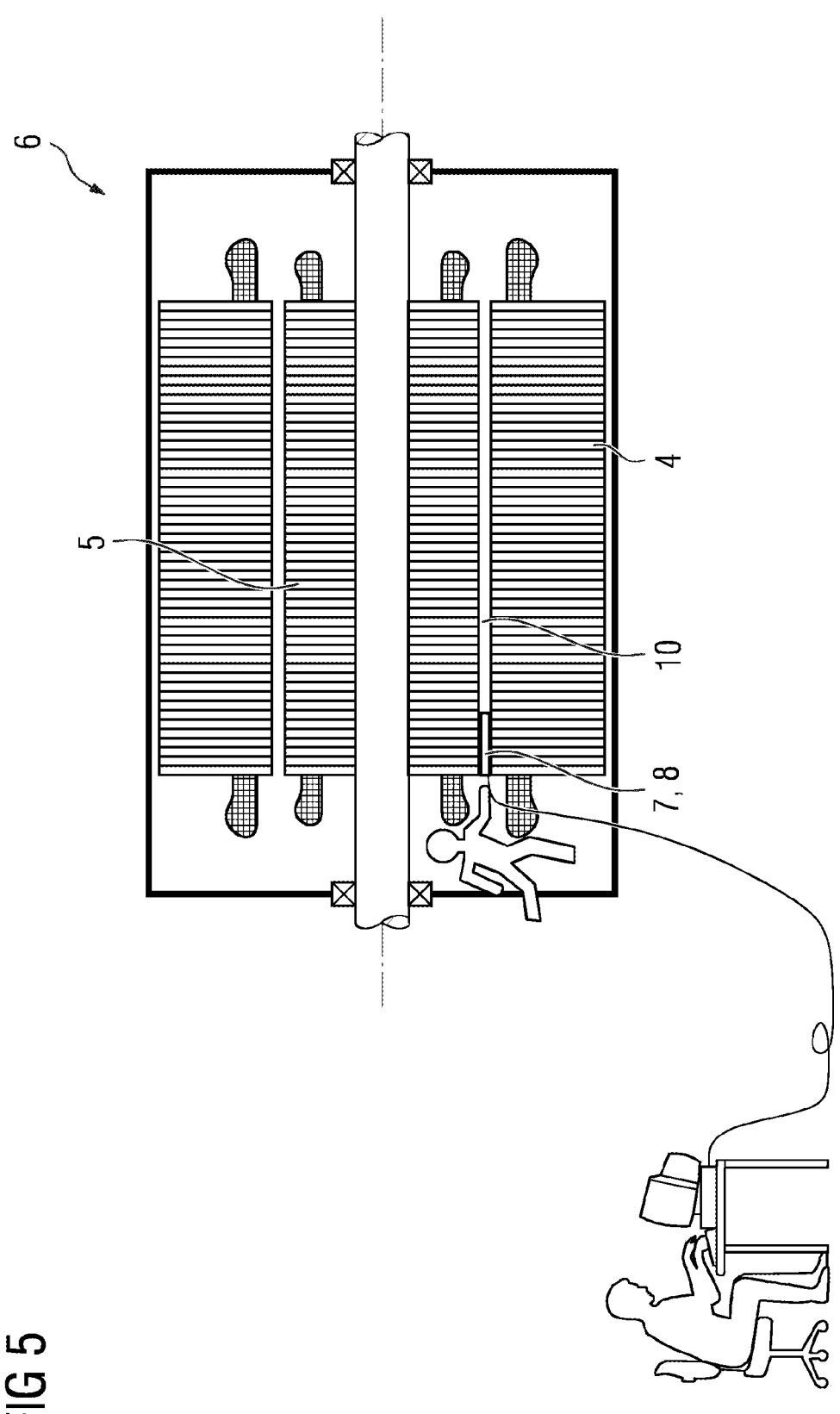
FIG. 5 shows a schematic lateral view of the machine to be tested.

For testing the electric machine 6 while using the system 1 described above, the following steps are carried out with reference to FIG. 5. In a first step, the track changeover unit 8 including the test vehicle 7 received in the parking cassette 19 is inserted into the air gap 10 between the rotor 5 and the stator 4, and placed onto the stator 4 in such a manner that the drive chains 13 of the test vehicle 7 are co-aligned with two adjacent laminated core teeth 2 of the stator 4 and thus point in the axial direction A. In contrast, the drive chains 26 of the drive units 21 of the track changeover unit 8 point in the circumferential direction U of the stator 4. In a further step, the test vehicle 7 is moved in the axial direction A out of the parking cassette 19 and displaced along the laminated core teeth 2 of the stator 4, wherein the test vehicle 7, while using the test device 15, tests the state of the stator 4 in the region of the internal circumferential face and/or the state of the rotor 5 in the region of the external circumferential face along the axial displacement path. In the process, the sensor data of the sensors of the test device 15 are transmitted to the controller 9 by way of the cable 18. The test vehicle 7 is subsequently axially moved back and parked again in the parking cassette 19 of the track changeover unit 8. Reaching the parking position in an orderly manner is detected by the sensor 23 and transmitted to the controller 9 by way of the wireless unit 34. Henceforth, the track changeover unit 8, conjointly with the test vehicle 7 received therein, is displaced along the stator 4 in the circumferential direction U while activating the drive units 21, until the drive chains 13 of the test vehicle 7 are axially co-aligned with the adjacent two laminated core teeth 2, this being detected by the cameras 24 and transmitted to the controller 9 by way of the wireless unit 34. A further test pass of the test vehicle 7 in the axial direction A then follows. The displacement of the track changeover unit 8 and the test passes 7 of the test vehicle are repeated until the track changeover unit 8 has been displaced by 360° in the circumferential direction U, and complete testing has been correspondingly carried out.

The system 1 described above is in particular distinguished in that manual moving of the test vehicle 7 in the circumferential direction U of the stator 4 after each axial test pass of the test vehicle 7 is dispensed with. In this way, personnel costs and time can be saved, and the degree of automation of testing can be increased, this having significantly lower costs as a consequence.

While the invention has been illustrated and described in more detail by the preferred exemplary embodiment, the invention is not restricted to the examples disclosed and other variations may be derived therefrom by a person skilled in the art without departing from the protective scope of the invention.

The invention claimed is:

1. A system comprising:

a test vehicle which is equipped with at least one test device and is adapted to be inserted into an air gap between a rotor and a stator of an electric machine, which stator has axially extending laminated core teeth and copper rods disposed between the laminated core teeth, and is adapted to be rectilinearly displaced along the laminated core teeth of the stator so as to test the state of the stator in a region of an internal circumferential face and/or the state of the rotor in a region of an external circumferential face while using the at least one test device, and

a track changeover unit which is insertable into the air gap between the rotor and the stator and is displaceable in the circumferential direction on the stator, comprising a parking cassette which is adapted for receiving the test vehicle and which the test vehicle can move into and out of in the axial direction through a parking cassette opening, at least one drive unit which has at least one motor and is adapted to move the track changeover unit, conjointly with the test vehicle received in the parking cassette, in the circumferential direction, and a controller for controlling at least the track changeover unit.

2. The system as claimed in claim 1, wherein the track changeover unit has two drive units which are positioned on sides of the parking cassette which are mutually opposite in the circumferential direction, and are connected to the parking cassette.

3. The system as claimed in claim 1, wherein each drive unit has at least two driven drive chains.

4. The system as claimed in claim 1, further comprising:

a sensor, which detects the presence of the test vehicle within the parking cassette, and which is provided on the parking cassette.

5. The system as claimed in claim 1, wherein the track changeover unit has at least one sensor which detects a spatial position of the track changeover unit.

6. The system as claimed in claim 1, wherein the track changeover unit has at least one camera monitoring a region in front of the parking cassette opening.

7. The system as claimed in claim 6, further comprising:

at least one illumination unit illuminating an imaging region of the at least one camera.

8. The system as claimed in claim 1, wherein the track changeover unit has accumulator units.

9. The system as claimed in claim 1, wherein, when the track changeover unit is placed on a flat surface, an overall height of the track changeover unit including the test vehicle received in the parking cassette is 19 mm or less.

10. The system as claimed in claim 1, wherein the track changeover unit is radio controlled.

11. The system as claimed in claim 1, wherein the test vehicle is tethered.

12. The system as claimed in claim 1, wherein the test vehicle and the track changeover unit on their respective lower side are provided with a plurality of magnets.

13. A method for testing an electric machine having a rotor and a stator which has axially extending laminated core teeth and copper rods disposed between the laminated core teeth, while using a system as claimed in claim 1, said method comprising:

a) inserting the track changeover unit including the test vehicle received therein into the air gap between the rotor and the stator, and placing onto the stator;

b) rectilinearly displacing the test vehicle in the axial direction along the laminated core teeth of the stator, wherein the test vehicle, while using the at least one test device, tests the state of the stator in the region of the internal circumferential face and/or the state of the rotor in the region of the external circumferential face along an axial displacement path;

c) parking the test vehicle in the parking cassette of the track changeover unit;

d) displacing the track changeover unit, conjointly with the test vehicle received therein, in the circumferential direction along the stator;

e) repeating steps b) to d), until the track changeover unit has been displaced by 360° in the circumferential direction.

14. The system as claimed in claim 1, wherein the electric machine comprises a generator.

15. The system as claimed in claim 1, wherein the at least one drive unit is pivotably connected to the parking cassette.

16. The system as claimed in claim 4, wherein the sensor comprises a distance sensor.

17. The system as claimed in claim 5, wherein the at least one sensor comprises a gyroscopic sensor.

18. The system as claimed in claim 8, wherein the accumulator units are positioned on the at least one drive unit.

19. The system as claimed in claim 11, wherein the test vehicle is tethered by a cable which is routed through a cable feedthrough opening provided on an axial end wall of the parking cassette.

* * * * *